United States Patent [19]

Martignoni et al.

[11] Patent Number: 5,160,854
[45] Date of Patent: Nov. 3, 1992

[54] SINGLE-DRIVE LEVEL SHIFTER WITH LOW DYNAMIC IMPEDANCE

[75] Inventors: Fabrizio Martignoni, Morazzone; Claudio Diazzi, Milan; Albino Pidutti, Udine; Fabio Vio, Milan, all of Italy

[73] Assignee: SGS-Thomson Microelectronics S.r.l., Milan, Italy

[21] Appl. No.: 734,911

[22] Filed: Jul. 24, 1991

[30] Foreign Application Priority Data

Jul. 27, 1990 [IT] Italy .................. 21086 A/90

[51] Int. Cl.$^5$ ........................ H03K 19/0175
[52] U.S. Cl. .................. 307/264; 307/475; 307/451; 307/558; 307/272.3; 307/594
[58] Field of Search ............ 307/264, 475, 451, 558, 307/559, 272.3, 594, 597

[56] References Cited

U.S. PATENT DOCUMENTS

| | | | |
|---|---|---|---|
| 4,501,978 | 2/1985 | Gentile et al. | 307/475 |
| 4,506,164 | 3/1985 | Higuchi | 307/264 |
| 4,791,323 | 12/1988 | Austin | 307/451 |
| 4,829,203 | 5/1989 | Ashmore, Jr. | 307/451 |
| 4,958,089 | 9/1990 | Fitzpatrick et al. | 307/475 |
| 4,958,091 | 9/1990 | Roberts | 307/475 |
| 5,036,226 | 7/1991 | Tonnu et al. | 307/475 |

Primary Examiner—Stanley D. Miller
Assistant Examiner—Scott A. Ouellette

[57] ABSTRACT

A level shifter, particularly suited for driving power stages for supplying power to integrated circuits, includes a DMOS transistor (40) which is driven by a digital signal source (42) and has a load resistor (44) as its drain load. A shifted output signal develops at the ends of said load resistor. The drain (V1) of the DMOS transistor is connected to the input of an inverter (46), while a Zener diode (54) and a second transistor (52) are connected in parallel with the load resistor (44), the gate of the second transistor (52) being driven by the output of the inverter (46). The output of the inverter (46) can be connected to the input of a drive stage (48), the output of which drives a power stage (50) for supplying power to an integrated circuit.

19 Claims, 2 Drawing Sheets

SINGLE-DRIVE LEVEL SHIFTER WITH LOW DYNAMIC IMPEDANCE

FIELD OF THE INVENTION

The present invention relates to a single-drive level shifter, with low dynamic impedance. In one aspect, the invention relates to such a single-drive level shifter which is suitable for being implemented in integrated form in CMOS technology. In another aspect, the invention relates to an improved level shifter for driving power stages for supplying power to integrated circuits.

BACKGROUND OF THE INVENTION

Several circuits for providing level shifting in such situations are known. Most of these known circuits use a double drive, i.e. generally two DMOS (double-diffusion MOS) transistors in opposite phase, which set or reset a bistable circuit which drives an inverter stage to drive the power stage. A schematic example of such a circuit is illustrated in FIG. 1, wherein two DMOS transistors 10 and 12, provided with resistive loads 14 and 16 and with voltage-limiting Zener diodes 18 and 20, drive the set and reset inputs of a flip-flop 22. The output of flip-flop 22 drives a driver 24 for a power stage which is not illustrated.

Since either resistor 14 or resistor 16 carries current in any operating condition, circuits of this type have an undesirable continuous dissipation, besides occupying a large semiconductor area. Circuital variations have been proposed wherein the passive loads are replaced with active loads, in order to avoid continuous dissipation, but at the expense of a greater circuital complexity which further aggravates the problem of area occupation.

Besides double-drive structures, single-drive circuits have been proposed, in which area occupation is reduced but still at the cost of continuous dissipation. An example of this type of circuit is illustrated in FIG. 2, wherein a DMOS transistor 26, with a load constituted by a resistor 28 and by a Zener diode 30 arranged in parallel, drives an inverter driver 32 which drives a power transistor 34. The current pulse generated by the transistor 26 causes switching "on", whereas for switching "off" it is necessary to wait for the increase in the voltage of the drain of the transistor 25, i.e. of the node V1, with respect to the node V2. This voltage increase is controlled by the discharge of the parasitic capacitor 36 between the drain and the source of the transistor 34, and this leads to a delay with respect to double-drive circuits, especially during switching "on". This delay can be decreased by reducing the switching threshold of the following stage or by reducing the load resistor or the parasitic capacitor.

However, the above known circuits have another, subtler, disadvantage, especially for systems in which the supply voltage on the elements which are powered at switching "on", should not have a high slope. In these circuits, an excessively high slope dV/dt of the voltage can produce an injection of current in the parasitic capacitor of the DMOS transistor, which by passing through the load (whether active or passive) creates an unwanted voltage drop which can cause the early switching of the system, i.e. before the arrival of the drive signal on the DMOS transistor. The behavior of the output voltage V on the load as a function of time t is qualitatively illustrated in FIG. 3, where the point A indicates the instant at which the system is switched and the point B indicates the instant at which the drive signal is applied to the DMOS transistor.

Spurious switching "on" of the system could be eliminated by reducing the resistive value of the load, but with the consequence of further increasing dissipation.

SUMMARY OF THE INVENTION

An object of the invention is therefore to provide a new level shifter which is suitable for being implemented in integrated form in CMOS technology. Another object of the invention is to provide a level shifter which is particularly suitable for driving power stages for supplying power to integrated circuits. A further object of the invention is to provide a level shifter which requires a single transistor, has low dynamic impedance, and avoids both high continuous dissipation and the phenomenon of early switching "on".

The invention achieves these and other objects and advantages, such as will become apparent from the following description, by means of a single drive signal level shifter which comprises first and second transistors, a load element, a signal source, a voltage source, an inverter, and a drive stage. The first transistor is a DMOS transistor, while the second transistor is a MOS transistor. The signal source is connected to the gate of the first transistor. The first transistor is connected to the load element in series with each other and with the voltage source. The second transistor is connected in parallel with the load element. The inverter has its input connected to the connection of the first transistor to the load element, while the output of the inverter is connected to the input of a drive stage and to the gate of the second transistor.

In a presently preferred embodiment of a signal level shifter, suitable for being implemented in integrated form in CMOS technology, particularly for driving power stages for supplying power to integrated circuits, a single drive DMOS transistor, driven by a digital signal, has a load resistor as its drain load, with a Zener diode connected in parallel with the load resistor, with a shifted output signal developing at the ends of the load resistor. The drain of the DMOS transistor is connected to the input of the inverter. The second transistor is a P-channel transistor arranged in parallel with the load resistor, with the gate of the P-channel transistor being driven by the output of the inverter. The P-channel transistor has a significantly lower resistance than the load resistor. The output of the inverter is connected to the input of a drive circuit which drives a power circuit for supplying power to integrated circuits.

BRIEF DESCRIPTION OF THE DRAWINGS

In the accompanying drawings, which are given only by way of nonlimitative example.

DETAILED DESCRIPTION

Figure 1:
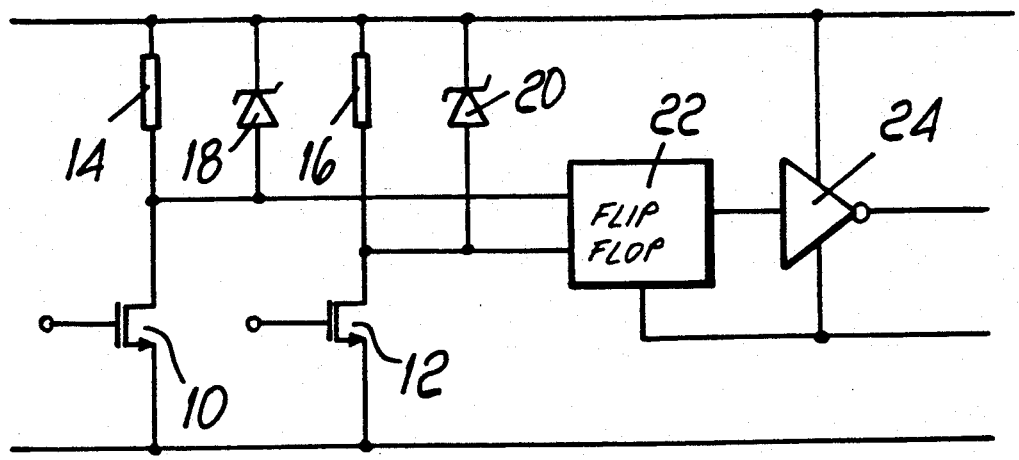
FIG. 1 is a circuit diagram of a double-drive level shifter, according to the prior art.
Figure 2:
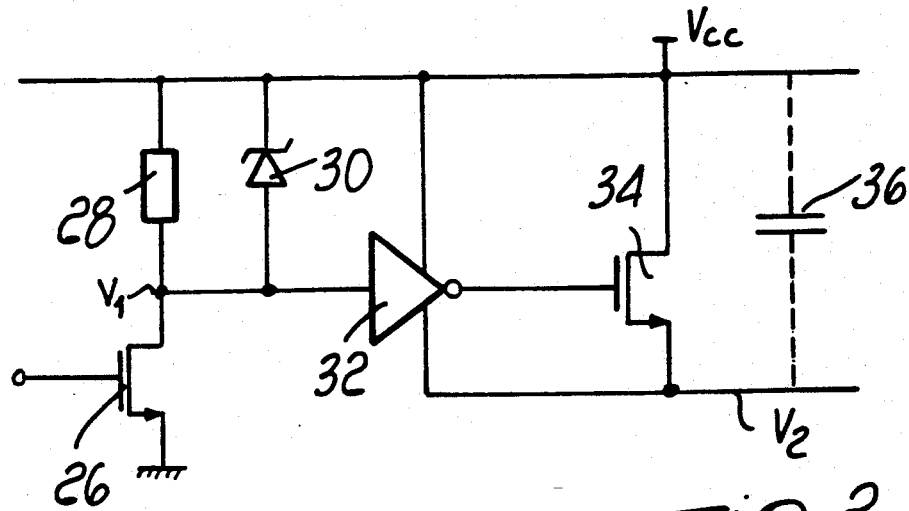
FIG. 2 is a circuit diagram of a prior art single-drive level shifter.
Figure 3:
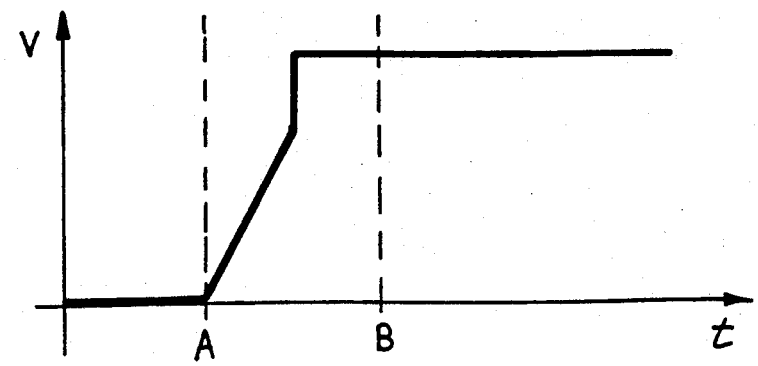
FIG. 3 is a chart useful for illustrating a disadvantage of prior art level shifters.
Figure 4:
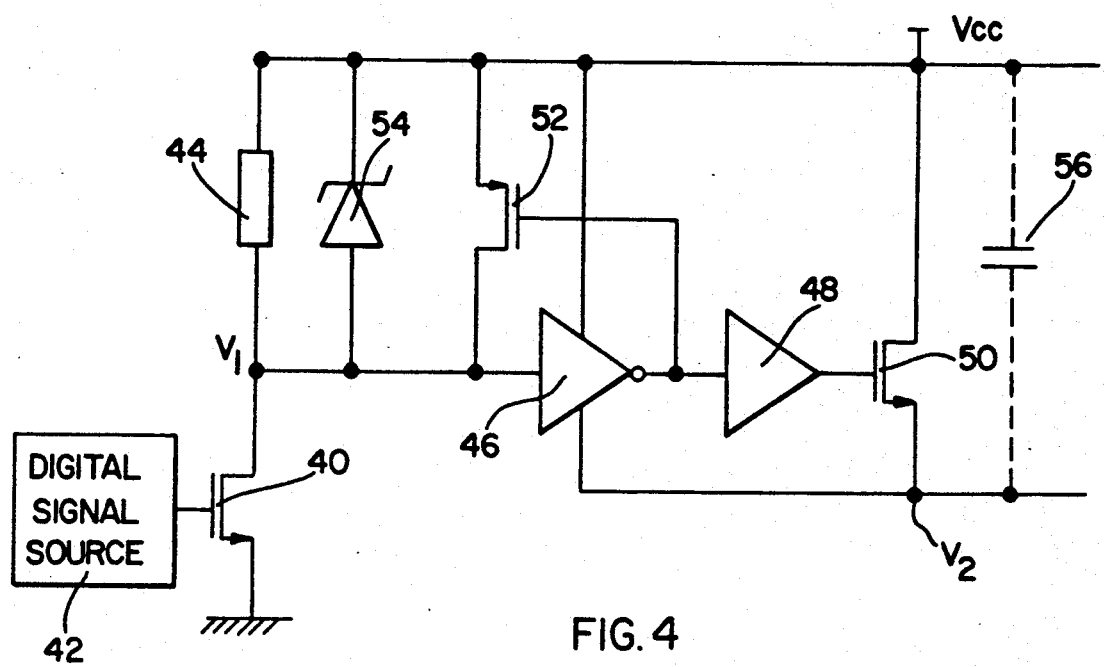
FIG. 4 is a circuit diagram of a single-drive level shifter according to a preferred embodiment of the invention.

The invention is now described in greater detail with reference to a preferred embodiment, illustrated in FIG. 4. In this level shifter a DMOS transistor 40 receives a digital signal from a digital signal source 42. The DMOS transistor 40 and a load resistor 44 are connected in series with each other between a voltage reference ground and a high voltage source $V_{cc}$, with the source of transistor 40 being connected to the voltage reference ground, such that resistor 44 serves as a drain load for transistor 40. The resistor 44 has a relatively high value, for example twenty kohm. The drain V1 of the DMOS transistor 40 drives an inverter 46. The output of the inverter 46 in turn drives a driver stage 48 for driving a power transistor 50 which is powered by the floating voltage between $V_{cc}$ and V2.

A P-channel transistor 52 is connected in parallel to the resistor 44, and is dimensioned so as to have a low conduction resistance, for example one kohm. The gate of the transistor 52 is also driven by the output of the inverter 46. A Zener diode 54 is connected in parallel to the transistor 52 and the load resistor 44.

In the absence of a digital signal at the input gate of the DMOS transistor 40, the transistor 40 is "off", its drain is high, and the output of the inverter 46 is low. The P-channel transistor 52 is thus "on". When the digital signal source 42 applies an impulse to the gate of the DMOS transistor 40, the voltage on the drain of transistor 40 drops, and thus the output of the inverter 46 tends to rise, leading the P-channel transistor 52 toward the switching "off" condition. A positive feedback is triggered which facilitates switching, because the impedance of the load on the DMOS transistor 40 tends to increase (due to the switching "off" of the transistor 52), and thus the voltage of the drain of the DMOS transistor 40 tends to decrease and the output of the inverter 46 tends to increase. The power transistor 50 thus switches "on", and once it is "on", a low current in the resistor 44 is sufficient to maintain this condition.

Figure 5:
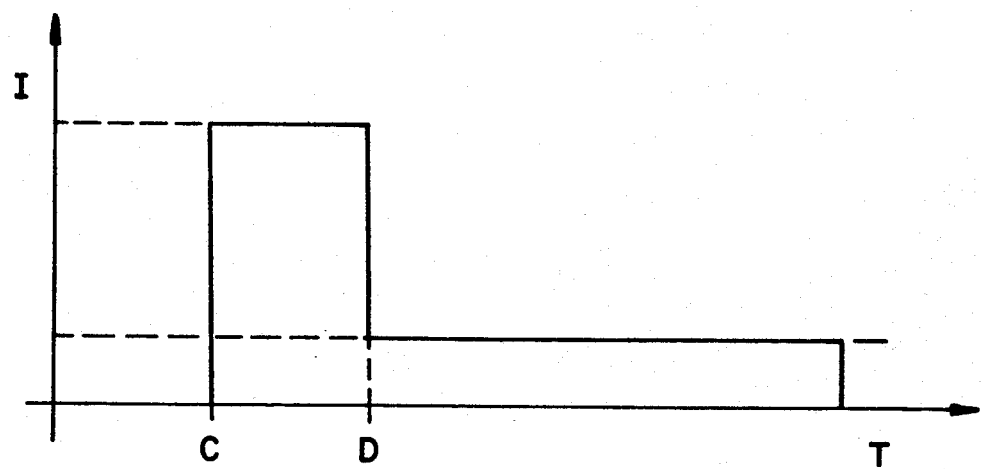
FIG. 5 is a chart of the behavior of the current in the driving transistor in the circuit of FIG. 4.

FIG. 5 illustrates the qualitative behavior of the current I in the DMOS transistor 40 as a function of the time t, where the point C is the instant at which the drive signal is applied from the source 42 and the point D is the instant at which switching is completed.

In the subsequent switching "off", the switching-off time constant is the one given by the parasitic capacitor 56. In this case, too, however, a positive feedback is triggered which accelerates switching by acting on the P-channel transistor 52.

However, it should be noted that since the transistor 52 has a low resistance, which is determined by its dimensions, the voltage drop on it, due to the dV/dt derivative in output, can be controlled so as to not cause the early switching "on" of the power transistor 50.

A preferred embodiment of the invention has been described, but it is understood that other modifications and variations which are within the scope of the inventive concept, can be employed.

We claim:

1. A single drive signal level shifter comprising first and second transistors, each having a drain, a gate and a source, said first transistor being a MOS transistor, and said second transistor being a MOS transistor; a signal source, said signal source being connected to the gate of said first transistor; a voltage source and a common terminal; a load element; said first transistor being connected in series with said load element between said voltage source and said common terminal; said second transistor being connected in parallel with said load element; an inverter having an input and an output, the input of said inverter being connected to the connection of said first transistor to said load element; a drive stage having an input and an output, the input of said drive stage being connected to the output of said inverter; the gate of said second transistor being connected to the output of said inverter and a Zener diode connected in parallel with said load element.

2. A circuit comprising a single drive signal level shifter in accordance with claim 1, and further including a power stage for supplying power to integrated circuits, said power stage having an input, the input of said power stage being connected to the output of said drive stage.

3. A single drive signal level shifter in accordance with claim 1 wherein said load element is a load resistor.

4. A single drive signal level shifter in accordance with claim 3 wherein said second transistor has a significantly lower resistance than said load resistor.

5. A single drive signal level shifter in accordance with claim 1 wherein said signal source applies a time-controlled signal to the gate of said first transistor.

6. A single drive signal level shifter in accordance with claim 1 which is implemented in integrated form in CMOS technology.

7. A single drive signal level shifter in accordance with claim 1 wherein said second transistor is a P-channel transistor, with the drain of said P-channel transistor being connected to the drain of said first transistor.

8. A single drive signal level shifter in accordance with claim 1 wherein said load element is connected between the drain of said first transistor and said voltage source.

9. A single drive signal level shifter in accordance with claim 8 wherein said second transistor is a P-channel transistor, with the drain of said P-channel transistor being connected to the drain of said first transistor.

10. A signal drive signal level shifter in accordance with claim 9 wherein said load element is a load resistor, and wherein said second transistor has a significantly lower resistance than said load resistor.

11. A single drive signal level shifter in accordance with claim 10 which is implemented in integrated form in CMOS technology.

12. A circuit comprising a single drive signal level shifter in accordance with claim 11, and further including a power transistor having a drain, a source and a gate; the gate of said power transistor is connected to the output of said drive stage and the source and drain terminals of said power transistor are connected between said voltage source and a circuit node wherein said power transistor selectively charges said circuit node.

13. A single drive signal level shifter in accordance with claim 9 wherein said load element is a load resistor.

14. A single drive signal level shifter in accordance with claim 13 wherein said signal source applies a time-controlled signal to the gate of said first transistor.

15. A single drive signal level shifter in accordance with claim 14 which is implemented in integrated form in CMOS technology.

16. A single drive signal level shifter in accordance with claim 15 wherein said P-channel transistor has a significantly lower resistance than said load resistor.

17. A circuit comprising a single drive signal level shifter in accordance with claim 16, and further including a power transistor having a drain, a source and a gate; the gate of said power transistor is connected to the output of said drive stage and the source and drain terminals of said power transistor are connected between said voltage source and a circuit node wherein said power transistor selectively charges said circuit node.

18. A single drive signal level shifter comprising first and second transistors, each having a drain, a gate and a source, said first transistor being a MOS transistor, and said second transistor being a MOS transistor; a signal source, said signal source being connected to the gate of said first transistor; a voltage source and a common terminal; a load element; said first transistor being connected in series with said load element between said voltage source and said common terminal; said second transistor being connected in parallel with said load element; an inverter having an input and an output, the input of said inverter being connected to the connection of said first transistor to said load element; a drive stage having an input and an output, the input of said drive stage being connected to the output of said inverter; the gate of said second transistor being connected to the output of said inverter and a voltage limiter connected in parallel to said load element.

19. A single drive signal level shifter comprising first and second transistors, each having a drain, a gate and a source, said first transistor being a MOS transistor, and said second transistor being a MOS transistor; a signal source, said signal source being connected to the gate of said first transistor; a voltage source and a common terminal; a load element; said first transistor being connected in series with said load element between said voltage source and said common terminal; said second transistor being connected in parallel with said load element; an inverter having an input and an output, the input of said inverter being connected to the connection of said first transistor to said load element; a drive stage having an input and an output, the input of said drive stage being connected to the output of said inverter; the gate of said second transistor being connected to the output of said inverter and a voltage limiter coupled between said supply voltage and one of said drain and source of said first transistor.

* * * * *